United States Patent
Koba et al.

(10) Patent No.: US 9,453,887 B2
(45) Date of Patent: Sep. 27, 2016

(54) METHOD OF SELECTING USED SECONDARY BATTERY AND METHOD OF MANUFACTURING BATTERY PACK

(71) Applicants: PRIMEARTH EV ENERGY CO., LTD., Kosai-shi, Shizuoka (JP); TOYOTA JIDOSHA KABUSHIKI KAISHA, Toyota-shi, Aichi (JP)

(72) Inventors: Daisuke Koba, Toyohashi (JP); Sachio Takeda, Toyohashi (JP); Koichi Ichikawa, Kasugai (JP); Yasuhiro Takahashi, Miyoshi (JP); Hirochika Habu, Toyota (JP)

(73) Assignees: PRIMEARTH EV ENERGY CO., LTD., Kosai-shi (JP); TOYOTA JIDOSHA KABUSHIKI KAISHA, Toyota (JP)

(*) Notice: Subject to any disclaimer, the term of this patent is extended or adjusted under 35 U.S.C. 154(b) by 231 days.

(21) Appl. No.: 14/503,809

(22) Filed: Oct. 1, 2014

(65) Prior Publication Data
US 2015/0145521 A1    May 28, 2015

(30) Foreign Application Priority Data
Nov. 25, 2013  (JP) .................... 2013-242864

(51) Int. Cl.
| | |
|---|---|
| *G01N 27/416* | (2006.01) |
| *G01R 31/36* | (2006.01) |
| *H01M 10/42* | (2006.01) |
| *H01M 10/44* | (2006.01) |
| *H01M 10/34* | (2006.01) |
| *H01M 10/54* | (2006.01) |

(52) U.S. Cl.
CPC ...... *G01R 31/3627* (2013.01); *H01M 10/4207* (2013.01); *H01M 10/441* (2013.01); *H01M 10/443* (2013.01); *H01M 10/345* (2013.01); *H01M 10/54* (2013.01); *Y02W 30/84* (2015.05); *Y10T 29/49004* (2015.01)

(58) Field of Classification Search
USPC .......................................... 324/430
See application file for complete search history.

(56) References Cited

U.S. PATENT DOCUMENTS

| | | | | |
|---|---|---|---|---|
| 5,140,269 A | * | 8/1992 | Champlin | G01R 19/16542 320/132 |
| 5,703,469 A | * | 12/1997 | Kinoshita | G01R 31/361 320/152 |
| 6,310,462 B1 | * | 10/2001 | Arai | G01R 31/3624 320/132 |
| 7,062,390 B2 | * | 6/2006 | Kim | G01R 31/3651 320/132 |
| 7,405,571 B1 | * | 7/2008 | Liu | G01R 31/362 320/132 |

(Continued)

FOREIGN PATENT DOCUMENTS

| | | |
|---|---|---|
| JP | A-2006-079961 | 3/2006 |
| JP | A-2008-293703 | 12/2008 |

*Primary Examiner* — Samuel Berhanu
(74) *Attorney, Agent, or Firm* — Oliff PLC

(57) ABSTRACT

A method of selecting a used secondary battery includes an internal resistance measurement step of measuring a specific internal resistance (second internal resistance) at a specific battery temperature (second battery temperature) of each of used secondary batteries, and a selection step of selecting a used secondary battery or batteries having the specific internal resistance (second internal resistance) smaller than a preset threshold from the plurality of used secondary batteries whose specific internal resistances (second internal resistance) have been measured in order to exclude an electrode-deteriorated battery from the used secondary batteries.

9 Claims, 12 Drawing Sheets

(56) References Cited

U.S. PATENT DOCUMENTS

| | | | |
|---|---|---|---|
| 9,255,974 B2* | 2/2016 | Dong | G01R 31/3651 |
| 2008/0157777 A1* | 7/2008 | Yamabe | G01R 31/3648 |
| | | | 324/426 |
| 2009/0128157 A1* | 5/2009 | Moriya | G01R 31/3624 |
| | | | 324/426 |
| 2010/0047684 A1 | 2/2010 | Okumura et al. | |
| 2011/0254559 A1* | 10/2011 | Nakashima | B60L 3/0046 |
| | | | 324/427 |

* cited by examiner

METHOD OF SELECTING USED SECONDARY BATTERY AND METHOD OF MANUFACTURING BATTERY PACK

CROSS-REFERENCE TO RELATED APPLICATIONS

This application is based upon and claims the benefit of priority from the prior Japanese Patent Application No. 2013-242864 filed on Nov. 25, 2013, the entire contents of which are incorporated herein by reference.

BACKGROUND OF THE INVENTION

1. Field of the Invention

The present invention relates to a method of selecting used secondary batteries, and a method of manufacturing battery packs.

2. Related Art

Battery packs consisting of a plurality of secondary batteries electrically connected to each other have hitherto been used as the power source of electric cars and hybrid cars. Even after an electric car or hybrid car has been disposed of, sometimes, the battery pack that was mounted in the car is still usable. Also, even if the battery pack has been replaced with a new one because of failures in some of the secondary batteries constituting the battery pack, other secondary batteries than those with failures in the replaced old battery pack are still usable. Technologies for avoiding disposal by reusing such still usable ones of secondary batteries that were collected after being used as the power source of electric cars or hybrid cars (hereinafter referred to also as "used secondary battery") have been proposed in recent years (see, for example, Patent Document 1).

RELATED ART DOCUMENTS

Patent Documents

Patent Document 1: JP-A-2008-293703

Battery characteristics (such as internal resistance) of a large number of collected used secondary batteries vary largely because they have been used under various conditions. For this reason, battery packs fabricated by combining used secondary batteries with largely different internal resistances would sometimes show a temporary increase in battery voltage difference between the used secondary batteries constituting the battery pack during charge and discharge (in particular, during discharge in a low temperature environment). More specifically, the battery voltage would temporarily drop largely in used secondary batteries with a large internal resistance as compared to used secondary batteries with a small internal resistance. Such a temporary increase in battery voltage difference between the used secondary batteries with a large internal resistance and those with a small internal resistance may exceed an allowable limit. Accordingly, when the battery pack is combined with a control device that monitors the voltage difference between the used secondary batteries in the battery pack constituting the battery pack to determine whether or not the maximum difference is within an allowable limit, this control device would sometimes detect a voltage abnormality (of the voltage difference exceeding the allowable limit).

Patent document 1 proposes the following technique to combine used secondary batteries to build a battery pack. More specifically, internal resistance of collected used secondary batteries is measured in a normal temperature environment (specifically, 25° C.), and batteries having close internal resistances in a normal temperature environment are combined to build a battery pack. The document states that a temporary increase in battery voltage difference between used secondary batteries during charge and discharge (in particular, charge and discharge in a low temperature environment) can be suppressed by combining used secondary batteries having close internal resistances (with the difference between their internal resistances being within a preset limit) in a normal temperature environment. The document further states that, when the battery pack is used in combination with a control device that monitors the voltage difference between the used secondary batteries constituting the battery pack to determine whether or not the maximum difference is within an allowable limit, the possibility of a maximum battery voltage difference temporarily exceeding an allowable limit due to the influence of a temporary increase in the battery voltage difference can be reduced, whereby the possibility of a voltage abnormality being detected by the control device can be reduced.

SUMMARY OF INVENTION

Problems to be Solved by the Invention

However, sometimes, among the used secondary batteries, there may be a battery (hereinafter referred to as "electrode-deteriorated battery") in which voltage drops more largely than in other batteries (normal batteries) because the current density reaches a limiting current density in the electrode when the battery is discharged in a specific environment (in particular, when discharged in a high-load environment with, for example, a relatively large current at a low temperature of 0° C. or lower). If there is such an electrode-deteriorated battery included in the used secondary batteries of the battery pack, even if they have close resistances, a maximum voltage difference between the batteries may exceed an allowable limit and the control device may detect it as a voltage abnormality. It is not preferable to use electrode-deteriorated batteries to build a battery pack, as they reach their life limits earlier than other batteries (normal batteries). It was not possible to exclude such electrode-deteriorated batteries by the technology disclosed in Patent Document 1.

The present invention has been made to solve the above problems and has a purpose to provide a method of selecting used secondary batteries whereby electrode-deteriorated batteries are excluded from among the used secondary batteries, and a method of manufacturing battery packs.

Means of Solving the Problems

To achieve the above purpose, one aspect of the present invention provides a method of selecting a used secondary battery that is reusable from a plurality of collected used secondary batteries, comprising: an internal resistance measurement step of measuring a specific internal resistance at a specific battery temperature of each of the used secondary batteries; and a selection step of selecting used secondary batteries having the specific internal resistance smaller than a preset threshold from the plurality of used secondary batteries whose specific internal resistances have been measured; the threshold being set by a process including a step of measuring the specific internal resistance of each of a plurality of sample secondary batteries that are used secondary batteries prepared for determining the threshold; continuously discharging each of the sample secondary batteries at a battery temperature equivalent to the specific battery temperature, and measuring a minimum voltage in the each sample secondary battery during a period of the discharge; plotting the specific internal resistances and the minimum voltages of each of the sample secondary batteries to create a correlation chart; determining a regression line of sample secondary batteries including at least all of the sample secondary batteries having a specific internal resistance not exceeding a reference value among the plurality of sample secondary batteries in the correlation chart; determining a lower limit line that is parallel to the regression line and shifted a predetermined value from the regression line to a side where the minimum voltage is lower in the correlation chart; calculating a value obtained by dividing a ranking number of batteries in region of the plurality of sample secondary batteries in ascending order of the specific internal resistance by a total number of sample secondary batteries, wherein the batteries in region are contained in a region of the correlation chart where the specific internal resistance is larger than the reference value and the minimum voltage does not exceed the lower limit line; specifying a battery having a smallest specific internal resistance out of the batteries contained in the region and having a calculated value exceeding a preset value; and setting the specific internal resistance of the specified battery contained in the region as the threshold.

The selection method described above includes an internal resistance measurement step of measuring internal resistance of each of used secondary batteries at a specific battery temperature (specific internal resistance). The method further includes a selection step in which used secondary batteries having a specific internal resistance smaller than a preset threshold are selected from the plurality of used secondary batteries whose specific internal resistances have been measured. The threshold here is the specific internal resistance that is preliminarily set as mentioned above. The threshold is set in this way for the following reasons.

The above described "electrode-deteriorated battery" has a relatively large specific internal resistance. On the other hand, if a secondary battery has a relatively large specific internal resistance, it may not yet be an "electrode-deteriorated battery". However, it is at least empirically known that if a secondary battery has a small specific internal resistance (of not more than a reference value), it has not yet become an "electrode-deteriorated battery". Also, the electrode-deteriorated battery has a smaller minimum voltage than normal batteries (non-electrode-deteriorated batteries) during a discharge period in which it is discharged continuously at a battery temperature equivalent to the specific battery temperature, so that it will be included in the region below a lower limit line in the correlation chart mentioned above.

Therefore, in a correlation chart of specific internal resistance and minimum voltage, if a regression line of at least all sample secondary batteries that have a specific internal resistance not exceeding a reference value is drawn, and a lower limit line parallel to this regression line and shifted a predetermined value therefrom to a side where the minimum voltage is lower is drawn, electrode-deteriorated batteries will be contained in a region where the specific internal resistance is larger than the reference value and the minimum voltage is on or below the lower limit line.

It then follows that, by using a specific internal resistance of one of the batteries included in the region where the specific internal resistance is larger than the reference value and the minimum voltage is on or below the lower limit line as the threshold mentioned above, the "electrode-deteriorated batteries" can be excluded in the selection step described above. More specifically, a ranking number of batteries contained in the region in ascending order of the specific internal resistance is divided by a total number of sample secondary batteries, and, of the batteries contained in the region having this calculated value exceeding a preset value, a battery that has the smallest specific internal resistance is specified, and this specific internal resistance of the specified battery is used as the threshold, so that used secondary batteries that are not "electrode-deteriorated batteries" can be selected in the selection step.

Used secondary batteries here refer to secondary batteries collected after being used as the power source of an electric car or a hybrid car. The specific battery temperature may be, for example, a battery temperature lower than normal temperatures (e.g., 0° C. or lower).

The "battery temperature equivalent to the specific battery temperature" when measuring the minimum voltage (when continuously discharging sample secondary batteries) shall include the following temperatures other than the same temperature as the specific battery temperature. More specifically, even if the battery temperature is not the same as the specific battery temperature, if the specific internal resistance correlates to minimum voltage at a certain battery temperature similarly to during a continuous discharge at the specific battery temperature, such a battery temperature should be included in "the temperature equivalent to the specific battery temperature". This is because sometimes it is difficult to use the same temperature as the specific battery temperature that is used when measuring the specific internal resistance for measuring the minimum voltage due to differences in measurement methods of minimum voltage and internal resistance. "Continuous discharge" should preferably be a continuous discharge under high load during which the difference between the voltage drop amount of electrode-deteriorated batteries and that of non-electrode-deteriorated batteries is large.

The "reference value" of the specific internal resistance for determining a regression line is set in accordance with the type of secondary battery. For example, if the used battery is a nickel-metal hydride secondary battery, the "reference value" should preferably be a value corresponding to 70% of the specific internal resistance a battery initially has (e.g., non-used, new battery). The internal resistance of the nickel-metal hydride secondary battery reduces from the initial value as the battery is used and stabilizes at about 60% of the initial value. As deterioration progresses with the use, the internal resistance tends to rise gradually. From such characteristics of nickel-metal hydride secondary batteries, it is empirically known that there are no above described "electrode-deteriorated batteries" among the batteries having a specific internal resistance of 70% or less of the initial value. If the used battery is a lithium ion secondary battery, the "reference value" should preferably be a value corresponding to 130% of the specific internal resistance a battery initially has. The internal resistance tends to rise as the lithium ion secondary battery is used. From such characteristics of lithium ion secondary batteries, it is empirically known that there are no above described "electrode-deteriorated batteries" among the batteries having a specific internal resistance of 130% or less of the initial value.

Specific internal resistance of used secondary batteries can be measured as follows, for example. First, the used secondary batteries are charged until the SOC (State of Charge) reaches a predetermined level (of, for example, 50%). Here, a charged state that satisfies the condition of a nominal capacity (of, for example, 6.5 Ah) of used secondary batteries is considered as SOC 100%. Charging and discharging cycles are then repeated several times at a specific battery temperature (in a state in which the battery temperature is kept at a specific temperature). The battery voltage at this time is measured, and plotted relative to current value, and the slope of a regression line of these plots determined by applying a method of least squares is calculated. The calculated slope can be regarded as specific internal resistance.

In the above method of selecting a used secondary battery, preferably, the regression line is a regression line of sample secondary batteries having a specific internal resistance not exceeding the reference value, of the plurality of sample secondary batteries.

In the above selection step, a lower limit line is determined based on a regression line of sample secondary batteries having a specific internal resistance not exceeding the reference value, and the threshold is set based on this lower limit line. By thus setting the threshold based on the regression line of sample secondary batteries having a specific internal resistance not exceeding the reference value, "electrode-deteriorated batteries" can be excluded precisely.

In one of the above methods of selecting a used secondary battery, preferably, the predetermined value for determining the lower limit line is one half of an allowable voltage difference between the used secondary batteries determined by a control device of a battery pack during use of the battery pack formed by the plurality of used secondary batteries.

In the above selection step, the lower limit line for setting the threshold is drawn such as to be parallel to the regression line and shifted therefrom to a side where the minimum voltage is lower, by one half of an allowable voltage difference between the used secondary batteries determined by the control device of the battery pack during use of the battery pack formed by the plurality of used secondary batteries. By thus setting the threshold based on the lower limit line, "electrode-deteriorated batteries" can be excluded precisely. If a battery pack is formed by combining thus selected used secondary batteries, detection of a voltage abnormality by the control device of the battery pack when the battery voltage difference between the used secondary batteries exceeds an allowable limit during use of the battery pack can be prevented reliably.

In one of the above methods of selecting a used secondary battery, preferably, the specific battery temperature in the internal resistance measurement step is a temperature of 0° C. or less.

The battery voltage drops largely in "electrode-deteriorated batteries" as compared to non-electrode-deteriorated batteries during a continuous discharge period particularly at a battery temperature of 0° C. or less. Therefore, by measuring the specific internal resistance and minimum voltage at a battery temperature of 0° C. or less, the difference in minimum voltage between electrode-deteriorated batteries and non-electrode-deteriorated batteries is made clear, and the threshold for selecting non-electrode-deteriorated batteries can be set more appropriately.

In one of the above method of selecting a used secondary battery, preferably, the used secondary batteries are used nickel-metal hydride secondary batteries, and the reference value is a value of 70% of the specific internal resistance a nickel-metal hydride secondary battery initially has.

As mentioned above, in the case with nickel-metal hydride secondary batteries, it is empirically known that there are no "electrode-deteriorated batteries" among the batteries having an internal resistance of 70% or less of the initial value. In the above selection method, the threshold is set based on the reference value corresponding to a value of 70% of the specific internal resistance an initial nickel-metal hydride secondary battery has. This way, used secondary batteries that are not "electrode-deteriorated batteries" can be selected precisely in the selection step. The initial nickel-metal hydride secondary battery refers to a new, or almost new (used very shortly) nickel-metal hydride secondary battery.

Another aspect of the invention provides a method of manufacturing a battery pack formed by combining a plurality of used secondary batteries, comprising: a step of selecting a plurality of used secondary batteries from the plurality of used secondary batteries selected by the method of selecting a used secondary battery according to claim 1 such that a maximum difference between the specific internal resistances is within an allowable limit; and an assembling step of forming a battery pack by electrically connecting the plurality of selected used secondary batteries.

According to the method of manufacturing a battery pack, the battery pack is formed by electrically connecting used secondary batteries having a maximum difference between specific internal resistances within an allowable limit. In the manufacturing method, moreover, before selecting used secondary batteries for forming the battery pack, "electrode-deteriorated batteries" are excluded by the method of selecting used secondary batteries described above. Therefore, in the battery pack manufactured by the above method, a temporary increase in battery voltage difference between used secondary batteries during charge and discharge of the battery pack can be suppressed. When the battery pack is used in combination with a control device that monitors whether or not the maximum difference between the used secondary batteries constituting the battery pack is within an allowable limit, the possibility of a maximum battery voltage difference temporarily exceeding an allowable limit due to the influence of a temporary increase in battery voltage difference can be reduced, whereby the possibility of a voltage abnormality being detected by the control device can be reduced.

Another aspect of the invention provides a method of manufacturing a battery pack formed by combining a plurality of used secondary batteries, comprising: a first internal resistance measurement step of measuring a first internal resistance at a first battery temperature that is a normal temperature of each of the used secondary batteries; a second internal resistance measurement step of measuring a second internal resistance at a second battery temperature that is lower than the normal temperature of each of the used secondary batteries; a first selection step of selecting used secondary batteries having the second internal resistance smaller than a preset threshold from the plurality of used secondary batteries whose second internal resistances have been measured; a second selection step of selecting a plurality of used secondary batteries having a maximum difference between the first internal resistances not exceeding an allowable limit, as well as a maximum difference between the second internal resistances not exceeding the allowable limit, from the plurality of the used secondary batteries selected in the first selection step; an assembling step of forming the battery pack by electrically connecting the plurality of the used secondary batteries selected in the second selection step, the threshold being set by a process including a step of measuring the second internal resistance of each of a plurality of sample secondary batteries that are used secondary batteries prepared for determining the threshold; continuously discharging each of the sample secondary batteries at a battery temperature equivalent to the second battery temperature, and measuring a minimum voltage in the each sample secondary battery during a period of the discharge; plotting the second internal resistances and the minimum voltages of each of the sample secondary batteries to create a correlation chart; determining a regression line of sample secondary batteries including at least all of the sample secondary batteries having a specific internal resistance not exceeding a reference value among the plurality of sample secondary batteries in the correlation chart; determining a lower limit line that is parallel to the regression line and shifted a predetermined value from the regression line to a side where the minimum voltage is lower in the correlation chart; calculating a value obtained by dividing a ranking number of batteries in region of the plurality of sample secondary batteries in ascending order of the second internal resistance by a total number of the sample secondary batteries, wherein the batteries in region are contained in a region of the correlation chart where the second internal resistance is larger than the reference value and the minimum voltage does not exceed the lower limit line; specifying a battery having a smallest second internal resistance out of the batteries contained in the region and having a calculated value exceeding a preset value; and setting the second internal resistance of the specified battery contained in the region as the threshold.

In the above manufacturing method, prior to the second selection step of selecting a plurality of used secondary batteries having a maximum difference between first internal resistances (internal resistances at a first battery temperature that is a normal temperature) not exceeding an allowable limit, as well as a maximum difference between second internal resistances (internal resistances at a second battery temperature that is lower than the normal temperature) not exceeding an allowable limit, in a first selection step, used secondary batteries having a second internal resistance smaller than a preset threshold are selected from the plurality of used secondary batteries whose second internal resistances (internal resistances at a second battery temperature that is lower than the normal temperature) have been measured. The threshold is the second internal resistance that is preliminarily determined as mentioned above. Accordingly, used secondary batteries that are not "electrode-deteriorated batteries" can be selected correctly in the first selection step. Thereby, "electrode-deteriorated batteries" can be prevented from being included in the battery pack.

Sometimes, the first internal resistance of used secondary batteries correlates little to the second internal resistance. Therefore, even if the maximum difference between first internal resistances of used secondary batteries is within an allowable limit, sometimes, the maximum difference between second internal resistances could exceed the allowable limit. Therefore, if used secondary batteries that have internal resistances close to each other in a normal temperature environment of 25° C. are combined to build a battery pack as shown in JP-A-2008-293703, although the maximum voltage difference between batteries during charge and discharge could be controlled within an allowable limit at a first battery temperature, there was a possibility that the maximum difference between batteries could exceed an allowable limit at a second battery temperature that is lower than the normal temperature and the above described control device 30 may detect it as a voltage abnormality.

With this in view, in the above manufacturing method, the battery pack is formed by a plurality of used secondary batteries that are selected such that these batteries have a maximum difference between first internal resistances not exceeding an allowable limit, as well as a maximum difference between second internal resistances not exceeding an allowable limit. By thus forming the battery pack from used secondary batteries having not only similar first internal resistances but also similar second internal resistances, an increase in battery voltage difference between used secondary batteries during charge and discharge can be suppressed not only at the first battery temperature but also at the second battery temperature. Thereby, when the battery pack is used in combination with a control device that monitors the voltage difference between the used secondary batteries constituting the battery pack to determine whether or not the maximum difference is within an allowable limit, the possibility of a voltage abnormality being detected by the control device due to the influence of a temporary increase in the battery voltage difference during charge and discharge can further be reduced.

"Normal temperature" here refers to a temperature in a range of 15° C. to 35° C. The first battery temperature refers to a predetermined battery temperature within the range of normal temperatures, which is for example 25° C. The second battery temperature refers to a predetermined battery temperature within a range of temperatures lower than the normal temperature range, which is for example 0° C. or less (for example, −10° C.).

The "battery temperature equivalent to the second battery temperature" when measuring the minimum voltage (when continuously discharging sample secondary batteries) shall include the following battery temperatures other than the same battery temperature as the second battery temperature. More specifically, even if the battery temperature is not the same as the second battery temperature, if the second internal resistance correlates to minimum voltage at a certain battery temperature similarly to during a continuous discharge at the second battery temperature, such a battery temperature should be included in "the battery temperature equivalent to the second battery temperature". This is because sometimes it is difficult to use the same battery temperature as the second battery temperature that is used when measuring the second internal resistance for measuring the minimum voltage due to differences in measurement methods of minimum voltage and internal resistance. Above described "Continuous discharge" should preferably be a continuous discharge under high load (duty) during which the difference between the voltage drop amount of electrode-deteriorated batteries and that of non-electrode-deteriorated batteries is large.

The "reference value" of the second internal resistance for determining a regression line is set in accordance with the type of secondary battery. For example, if the used secondary battery is a nickel-metal hydride secondary battery, the "reference value" should preferably be a value corresponding to 70% of the second internal resistance a battery initially has (e.g., non-used, new battery). The internal resistance of the nickel-metal hydride secondary battery reduces from the initial value as the battery is used and stabilizes at about 60% of the initial value. As deterioration progresses with the use, the internal resistance tends to rise gradually. From such characteristics of nickel-metal hydride secondary batteries, it is empirically known that there are no above described "electrode-deteriorated batteries" among the batteries having a second internal resistance of 70% or less of the initial value. If the used secondary battery is a lithium ion secondary battery, the "reference value" should preferably be a value corresponding to 130% of the second internal resistance a battery initially has. The internal resistance tends to rise as the lithium ion secondary battery is used. From such characteristics of lithium ion secondary batteries, it is empirically known that there are no above described "electrode-deteriorated batteries" among the batteries having a second internal resistance of 130% or less of the initial value.

First internal resistance of used secondary batteries can be measured as follows, for example. First, the used secondary batteries are charged until the SOC (State of Charge) reaches a predetermined level (of, for example, 50%). Here, a charged state that satisfies the condition of a nominal capacity (of, for example, 6.5 Ah) of used secondary batteries is considered as SOC 100%. Charging and discharging cycles are then repeated several times at a first battery temperature (in a state in which the battery temperature is kept at a first temperature). The battery voltage at this time is measured, and plotted relative to current value, and the slope of a regression line of these plots determined by applying a method of least squares is calculated. The calculated slope can be regarded as first internal resistance. The second internal resistance may be measured by the measurement method described above, but with the battery temperature being changed to the second battery temperature (of, for example, −10° C.).

In the method of manufacturing a battery pack, preferably, the continuous discharge when measuring the minimum voltage is a continuous distinguishing discharge for a predetermined period of time with a discharge current within a predetermined sampling discharge current range.

The "discharge current within a predetermined sampling discharge current range" refers to a discharge current within a range with which, when the sample secondary batteries are discharged continuously at a battery temperature equivalent to the second battery temperature, the current density reaches a limiting current density at the electrode in electrode-deteriorated batteries, while it does not reach a limiting current density at the electrode in non-electrode-deteriorated batteries (normal batteries), because of which the voltage drops largely in electrode-deteriorated batteries as compared to the voltage in normal batteries, i.e., it is a discharge current, with which electrode-deteriorated batteries can be distinguished, based on the difference in the voltage drop amount. Such a discharge current may not be a constant value but may vary within a range, i.e., within the distinguishing discharge current range (of, for example, 2 to 6 C) in which the above-described phenomenon occurs. By setting the threshold based on such distinguishing discharge, used secondary batteries that are not "electrode-deteriorated batteries" can be selected correctly in the first selection step.

In one of the methods of manufacturing a battery pack, preferably, the second battery temperature in the second internal resistance measurement step is a temperature of 0° C. or less.

The battery voltage drops largely in above described "electrode-deteriorated batteries" during a continuous discharge period particularly at a battery temperature of 0° C. or less as compared to non-electrode-deteriorated batteries. Therefore, by measuring the second internal resistance and minimum voltage at a second battery temperature of 0° C. or less, the difference in minimum voltage between electrode-deteriorated batteries and non-electrode-deteriorated batteries is made clear, and the threshold for selecting non-electrode-deteriorated batteries can be set appropriately.

In one of the methods of manufacturing a battery pack, preferably, the used secondary batteries are used nickel-metal hydride secondary batteries, and the reference value is a value of 70% of the second internal resistance a nickel-metal hydride secondary battery initially has.

In the case with nickel-metal hydride secondary batteries, it is empirically known that there are no "electrode-deteriorated batteries" among the batteries having an internal resistance of 70% or less of the initial value. In the above selection method, the threshold is set with reference to a value of 70% of the second internal resistance a nickel-metal hydride secondary battery initially has. This way, used secondary batteries that are not "electrode-deteriorated batteries" can be selected precisely in the selection step.

In any of the above methods of manufacturing a battery pack, preferably, a preliminary selection step is included, in which used secondary batteries having a discharge reserve capacity in the negative electrode at or above an allowable level, and being free of small short circuits, are selected beforehand from the plurality of collected used secondary batteries prior to the first internal resistance measurement step.

Used secondary batteries with a discharge reserve capacity in the negative electrode that falls below an allowable minimum, and secondary batteries with small short circuits inside, should preferably be not reused because of the risk that they may not be able to be used appropriately as a power source. Therefore, in the above manufacturing method, secondary batteries having a discharge reserve capacity in the negative electrode at or above an allowable level, and secondary batteries free of small short circuits, are selected from the plurality of collected used secondary batteries prior to the first internal resistance measurement step. Such determination of whether or not the discharge reserve capacity in the negative electrode is below an allowable minimum may be made by any of known methods. Also, it may be determined whether or not there are small short circuits in the batteries by any of known methods.

DESCRIPTION OF EMBODIMENTS

Figure 1:
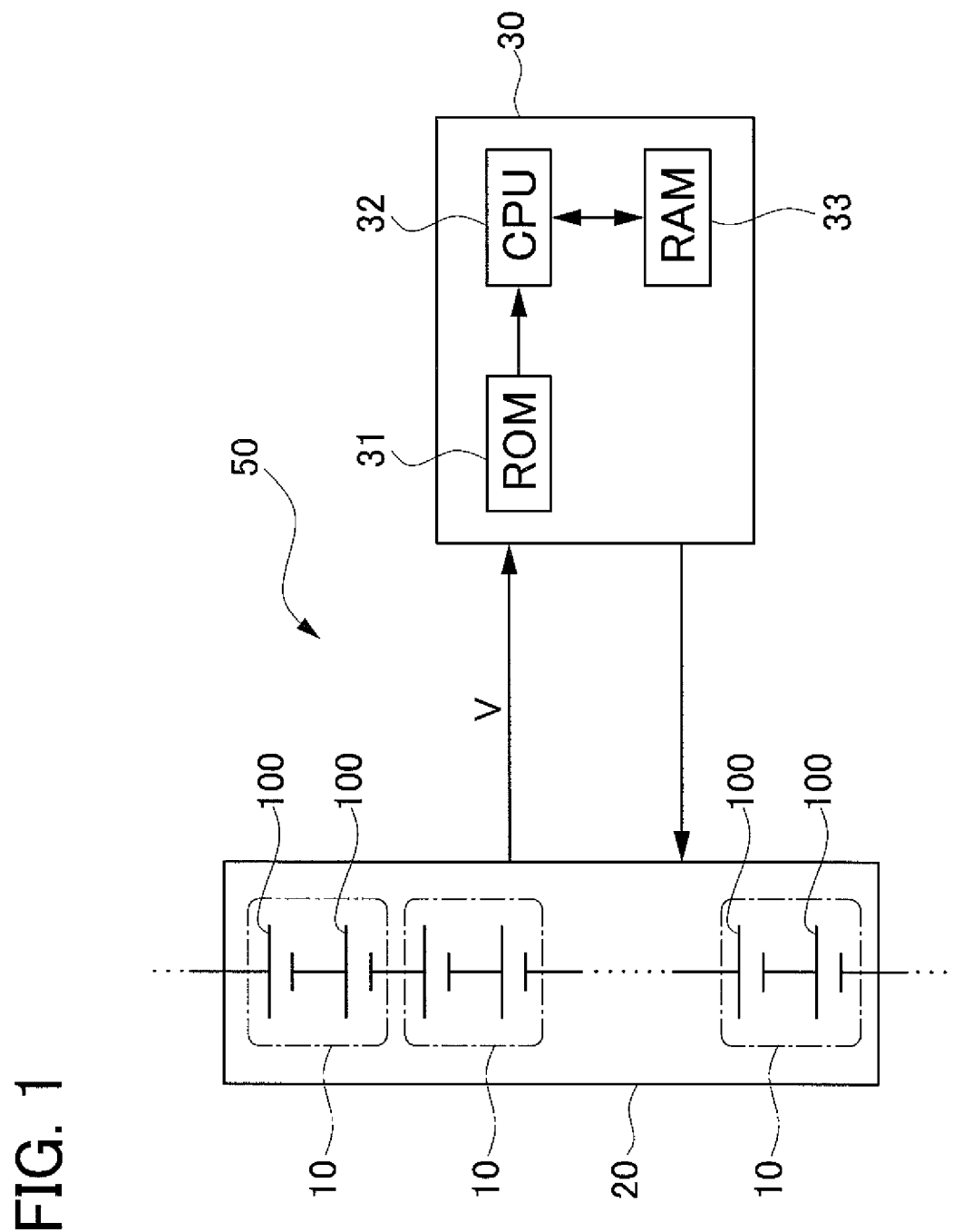
FIG. 1 is a schematic diagram of a battery pack unit according to one embodiment.

A detailed description of a preferred embodiment of the present invention will now be given referring to the accompanying drawings. First, a battery pack unit 50 according to this embodiment will be described. The battery pack unit 50 includes a battery pack 20 and a control device 30 that controls the battery pack, as shown in FIG. 1. The battery pack 20 contains twenty eight used nickel-metal hydride secondary batteries 100 electrically connected in series. More specifically, two used nickel-metal hydride secondary batteries 100 are electrically connected to form a battery block 10, and fourteen battery blocks 10 are electrically connected in series to form the battery pack 20.

Figure 2:
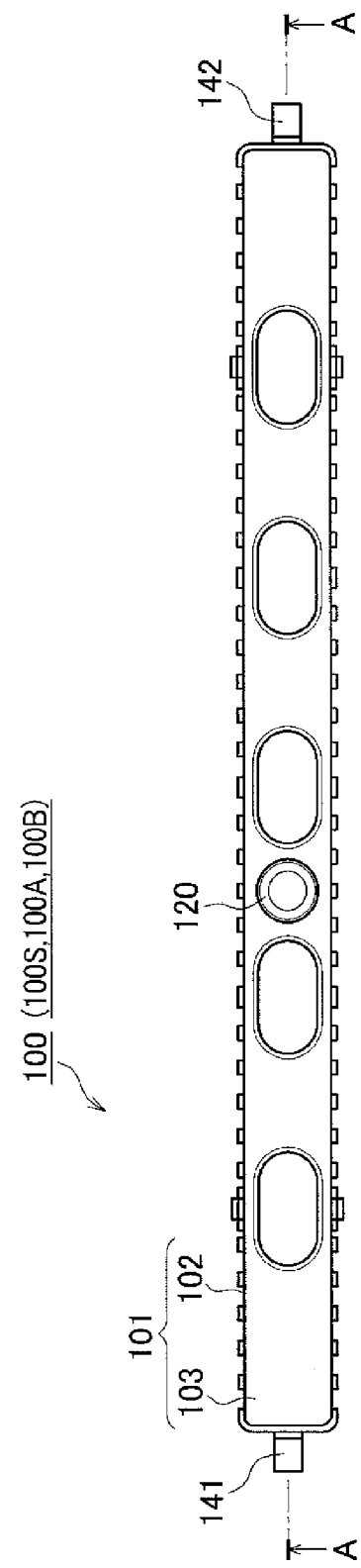
FIG. 2 is a top view of a used nickel-metal hydride secondary battery according to the embodiment.
Figure 3:
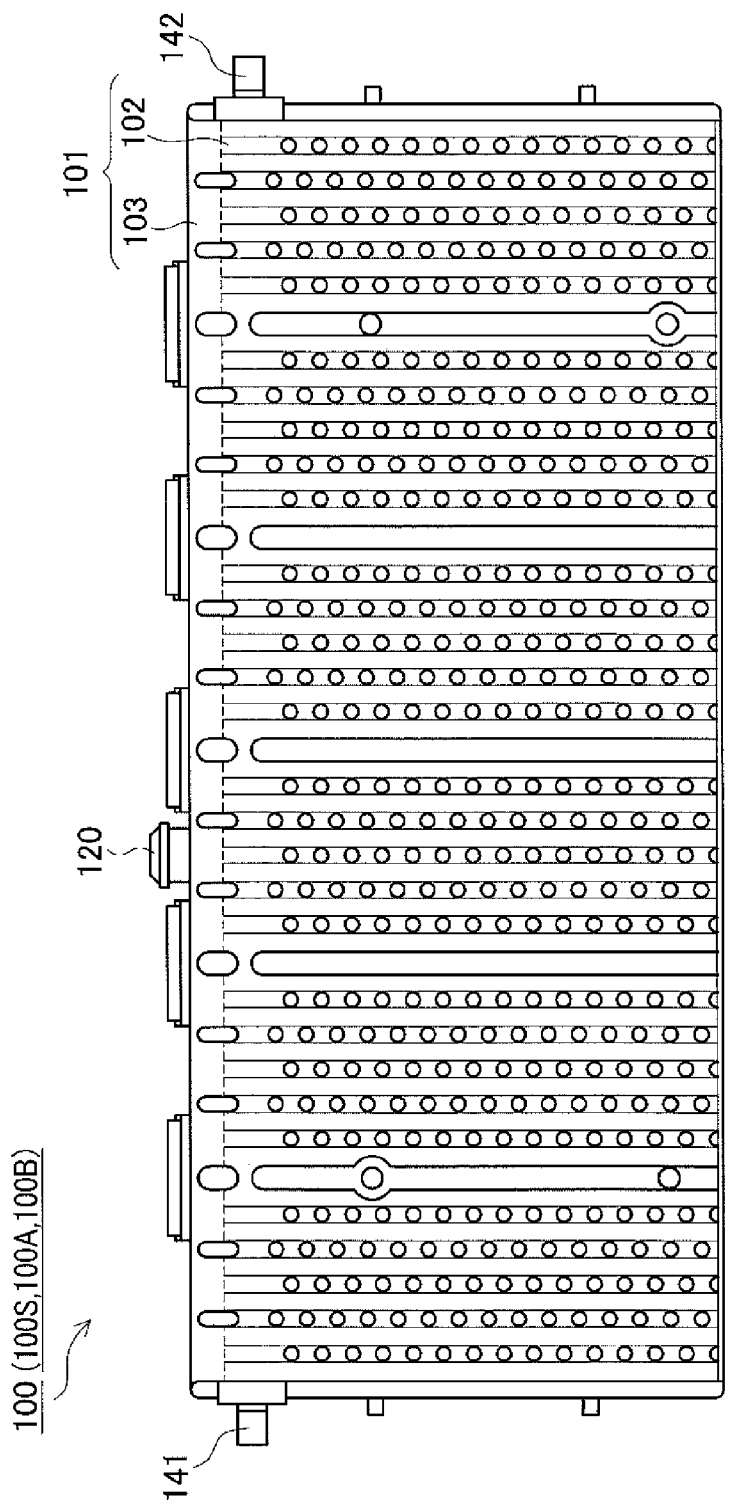
FIG. 3 is a side view of the battery.

The used nickel-metal hydride secondary batteries 100 (hereinafter, sometimes referred to simply as "battery 100") have been collected after being used as the power source of a hybrid car. The battery 100 is a rectangular sealed nickel-metal hydride secondary battery having a battery case 101, as shown in FIG. 2 and FIG. 3. The battery case 101 has a housing 102 and a lid 103. The lid 103 is made of resin and has a substantially rectangular planar shape. A safety valve unit 120 is attached to this lid 103. The housing 102 is made of resin and has a substantially rectangular box-like shape.

Figure 4:
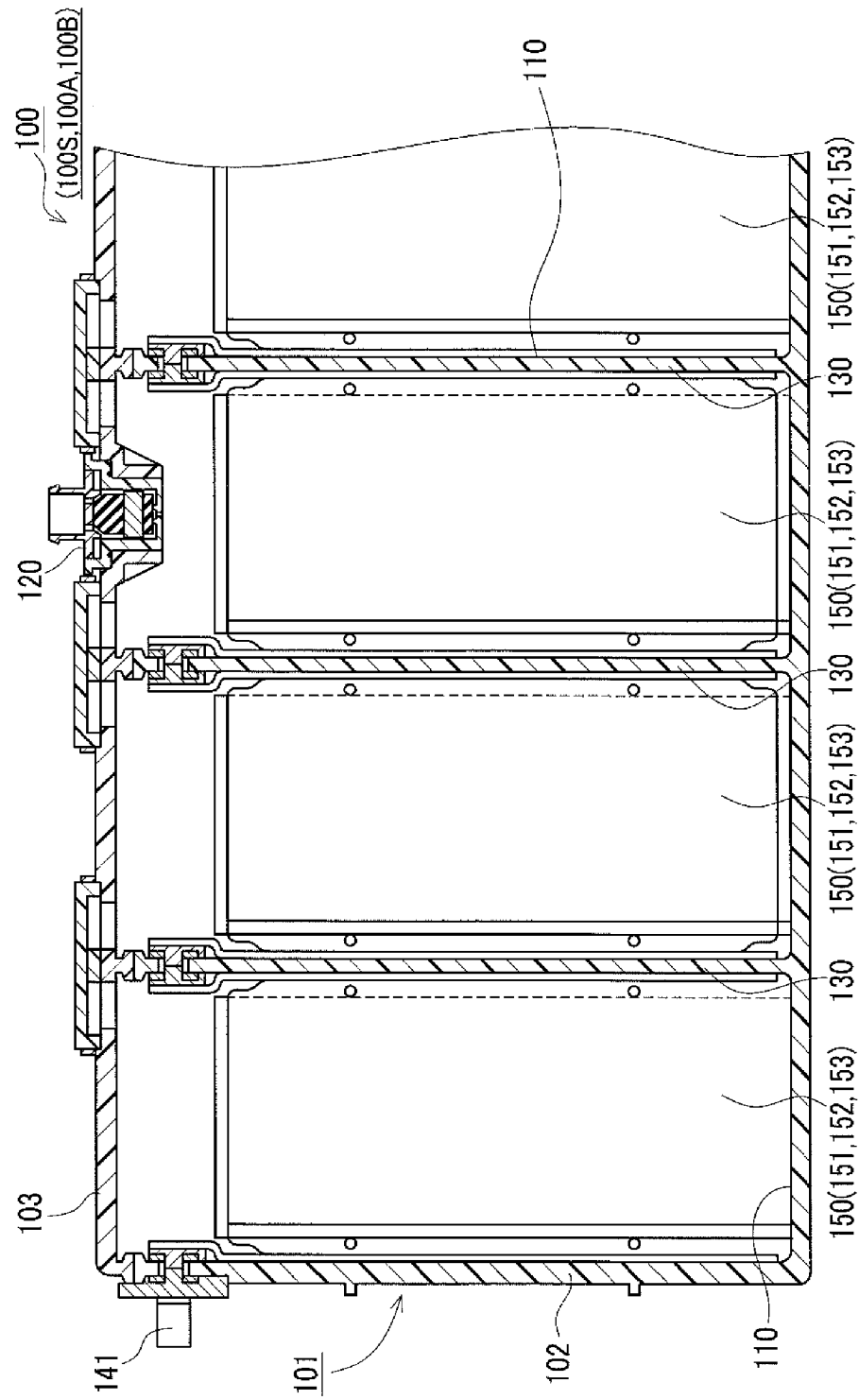
FIG. 4 is a cross section of A-A in FIG. 2, illustrating the inside of the battery.

The battery case 101 (housing 102) is divided into six compartments inside by partition parts 130 as shown in FIG. 4. Each compartment houses an electrode plate group 150 and liquid electrolyte (not shown), so that the battery 100 as a whole includes six cells 110. The electrode plate group 150 has positive electrodes 151, negative electrodes 152, and bag-shaped separators 153. Each positive electrode 151 is inserted in the bag-shaped separator 153, and the positive electrodes 151 in the separators 153 and the negative electrodes 152 are alternately stacked upon one another. Current collectors of the positive electrodes 151 and negative electrodes 152 in each cell 110 are connected in series and connected to a positive terminal 141 and a negative terminal 142, respectively.

For the positive electrode 151, for example, an electrode plate having an active material containing nickel hydroxide, and an active material carrier such as nickel foam may be used. For the negative electrode 152, for example, an electrode plate containing a hydrogen storing alloy as a constituent material may be used. For the separator 153, for example, non-woven cloth made of synthetic fiber processed to have hydrophilicity may be used. For the liquid electrolyte, for example, an alkaline solution containing KOH may be used. The battery 100 has a nominal capacity of 6.5 Ah.

The control device 30 is a known control device (see, for example, JP-A-2006-79961), and includes a ROM 31, CPU 32, RAM 33, and the like (see FIG. 1). The control device 30 senses the battery voltage V (voltage across terminals) of each battery 100 that forms the battery pack 20 during charge and discharge of the battery pack 20. The device then determines whether or not the difference between a maximum value and a minimum value of the sensed battery voltages V (maximum voltage difference) is within an allowable limit. If the device determines that the maximum voltage difference has exceeded the allowable limit, it decides that there is a voltage abnormality. The battery pack unit 50 of this embodiment is used as a drive power source of a hybrid car, for example.

Figure 6:
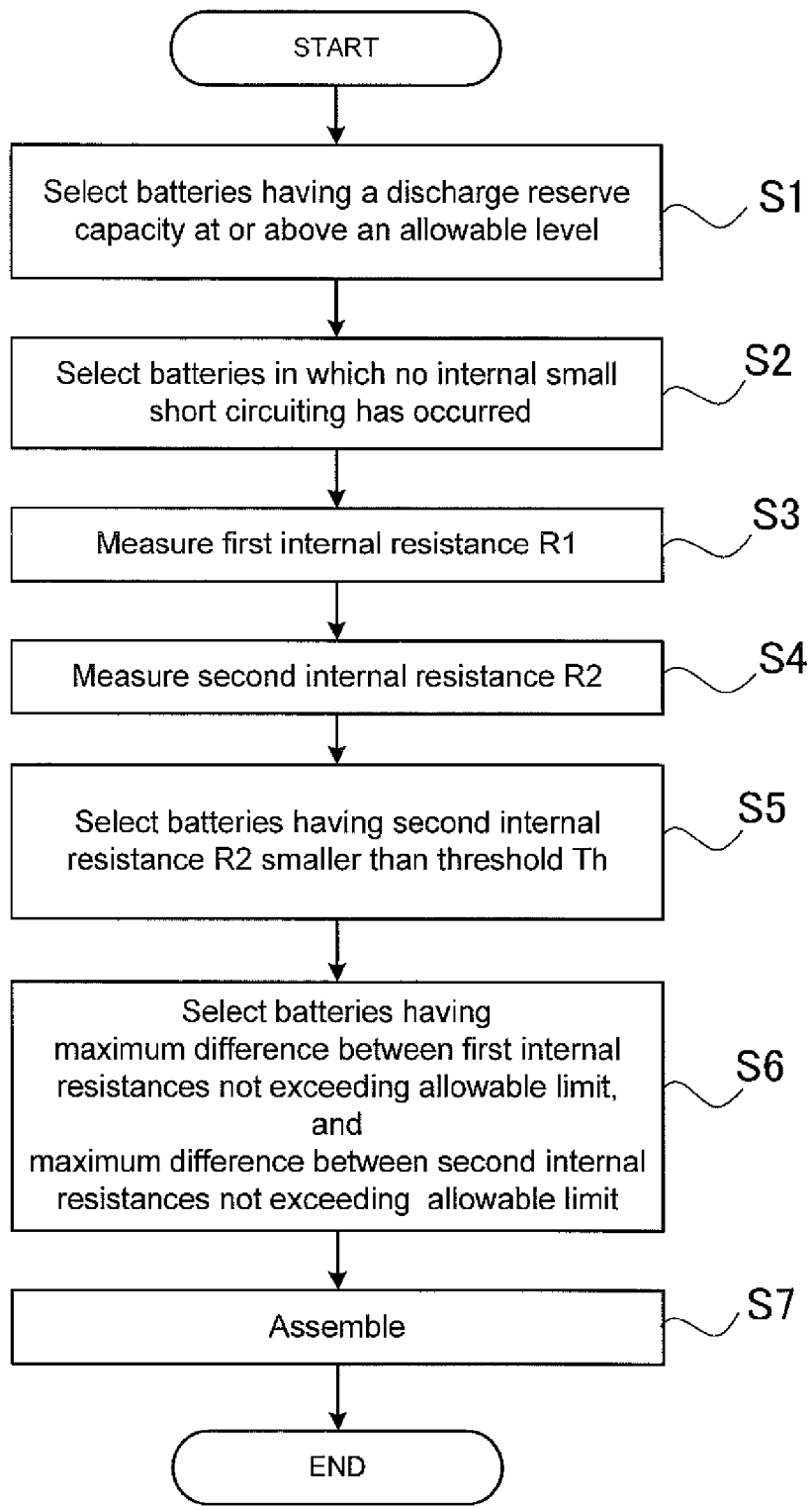
FIG. 6 is a flowchart showing the flow of a method of manufacturing a battery pack according to one embodiment.

Next, the method of manufacturing the battery pack 20 according to this embodiment will be described. FIG. 6 is a flowchart showing the flow of the method of manufacturing the battery pack 20 according to this embodiment. First, as shown in FIG. 6, batteries having a discharge reserve capacity at or above an allowable level are selected from the plurality of collected used nickel-metal hydride secondary batteries at step S1. At step S2, batteries in which no small short circuiting has occurred are selected from the batteries selected at step S1. In this embodiment, the processes of step Si and step S2 are carried out by the methods described below.

First, the process of step S1 will be described. In this embodiment, a plurality of used nickel-metal hydride secondary batteries are collected in the form of battery packs. More specifically, the plurality of used nickel-metal hydride secondary batteries are collected in the form of a battery pack, which, as with the battery pack 20, has fourteen electrically series-connected battery blocks, each block consisting of two electrically connected used nickel-metal hydride secondary batteries. Next, each of the battery blocks in each collected battery pack is discharged until the voltage reaches a lower limit (of 6 V which corresponds to SOC0%), to measure the discharge capacity of each battery block during this discharge period. Using a maximum value of discharge capacities of the battery blocks in each battery pack as a reference, a difference value of each battery block is obtained by subtracting the respective discharge capacity from the maximum discharge capacity (this difference value will be referred to as "inter-block capacity difference"). Then, batteries included in battery blocks having an inter-block capacity difference that is equal to or smaller than a preset threshold are considered as batteries having a discharge reserve capacity at or above an allowable level.

Figure 10:
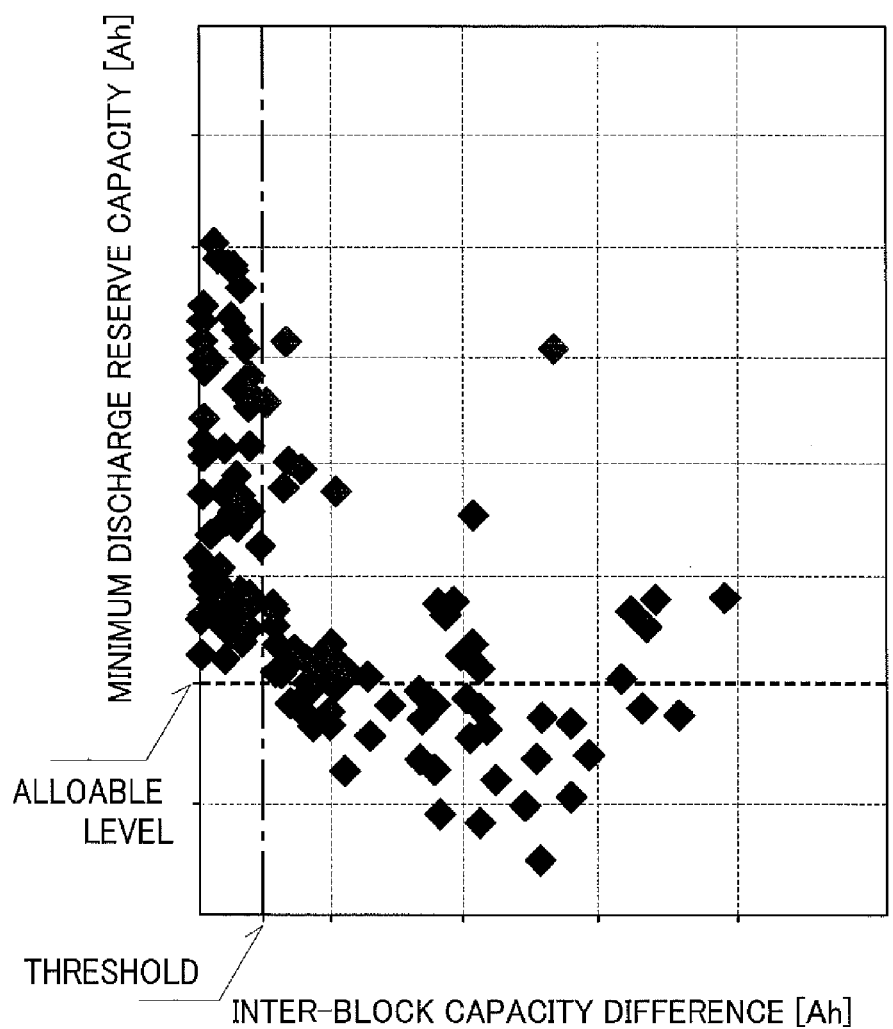
FIG. 10 is a chart for explaining a preliminary selection step.

The threshold of the inter-block capacity difference is predetermined as follows. First, a multiplicity of sample battery packs are prepared for determining a threshold. Inter-block capacity differences are determined as described above for these battery packs. The discharge reserve capacities of batteries contained in respective battery blocks are then measured to determine minimum values of discharge reserve capacity of batteries that had a lowest discharge reserve capacity. The inter-block capacity difference data and minimum discharge reserve capacity data of the plurality of battery blocks are plotted on a coordinate plane with axes representing inter-block capacity difference and minimum discharge reserve capacity to make a correlation chart. FIG. 10 shows the thus created correlation chart.

In this embodiment, as shown in FIG. 10, the allowable level of the discharge reserve capacity is indicated by a broken line. As we can see from the correlation chart of FIG. 10, battery blocks having a value of inter-block capacity difference of or below the level indicated by a one-dot chain line all show a minimum discharge reserve capacity that does not fall below the allowable level. Namely, all the battery blocks having a value of inter-block capacity difference of or below the level of the one-dot chain line contain only batteries with a discharge reserve capacity at or above an allowable level. The threshold of inter-block capacity difference is thus set to a value indicated by the one-dot chain line in FIG. 10 based on these results.

Next, the process of step S2 will be described. During the discharge period mentioned above, the battery voltage of each battery is measured. The voltage change rate (V/Ah) at the end of discharge is then calculated for each battery. Batteries having a voltage change rate of less than a preset threshold are considered as batteries free of small short circuits, and selected.

Figure 11:
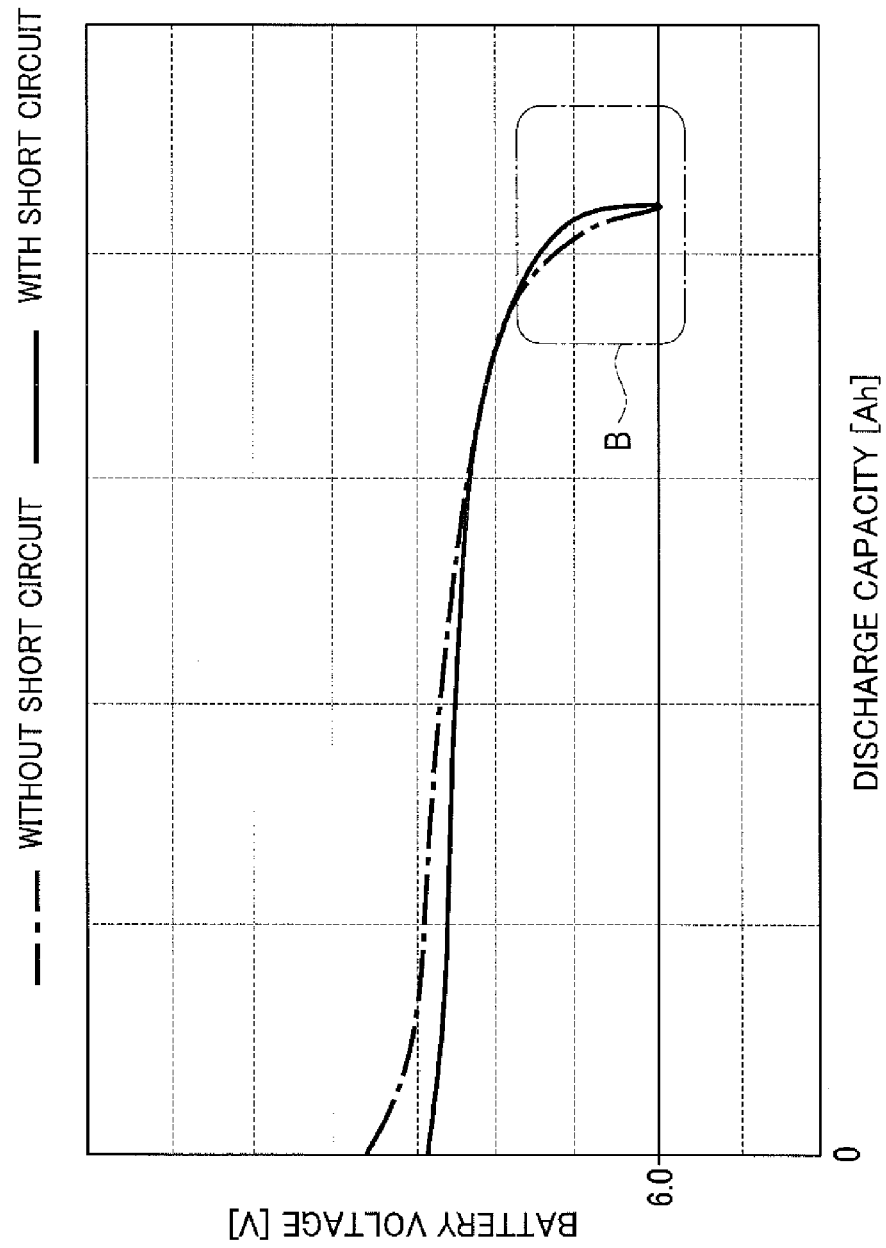
FIG. 11 is another chart for explaining the preliminary selection step.
Figure 12:
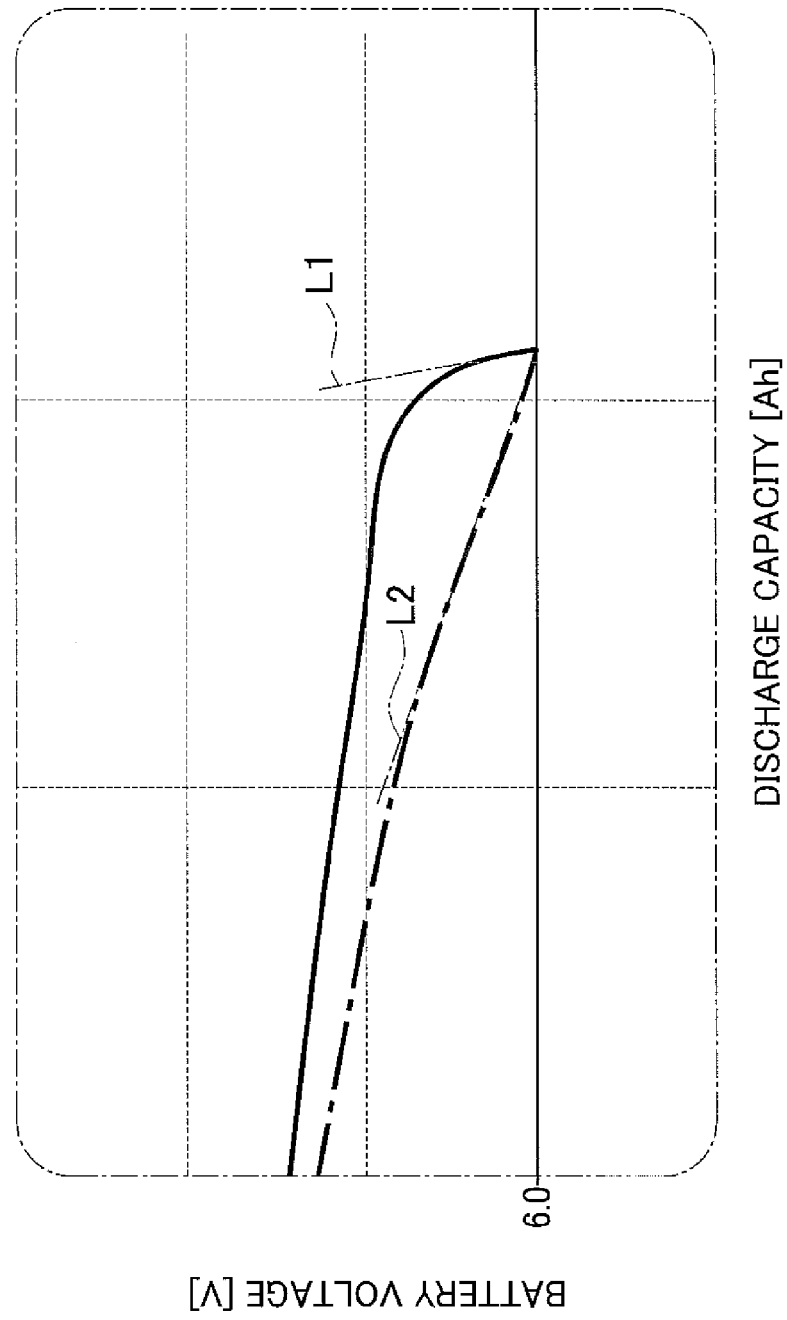
FIG. 12 is an enlarged view of part B of FIG. 11.

FIG. 11 shows a correlation chart (discharge curves) of discharge capacity (Ah) and battery voltage (V) of a battery without internal small short circuits and a battery with internal small short circuits. In FIG. 11, the discharge curve of the battery without internal small short circuits is indicated by a one-dot chain line, while the discharge curve of the battery with internal small short circuits is indicated by a solid line. FIG. 12 shows an enlarged view of part B of FIG. 11. In FIG. 12, a line tangential to the discharge curve of the battery with small short circuits at a discharge end point is denoted as L1. A line tangential to the discharge curve of the battery without small short circuits at a discharge end point is denoted as L2. The slope of the tangential line L1 and L2 represents the voltage change rate (V/Ah).

As shown in FIG. 12, the slope of the tangential line L1 has a larger absolute value than that of the slope of the tangential line L2. Namely, the voltage change rate at the end of discharge of the battery with small short circuits has a larger absolute value than that of the voltage change rate at the end of discharge of the battery without small short circuits. Therefore, by examining the voltage change rate at the end of discharge of each of a multiplicity of batteries, a threshold can be determined, whereby batteries are sorted to those with small short circuits and those without. Step Si and step S2 correspond to a "preliminary selection step".

Next, the process goes to step S3, where a first internal resistance R1 of each of the used nickel-metal hydride secondary batteries 100 selected at step S2 is measured at a first battery temperature which is a normal temperature (of 25° C. in this embodiment). This step S3 corresponds to a "first internal resistance measurement step".

The first internal resistance R1 is measured as follows in this embodiment. First, the used secondary batteries are charged until SOC is 50%. Here, a charged state that satisfies the condition of a nominal capacity (of, for example, 6.5 Ah) of used secondary batteries is considered as SOC 100%. The used secondary batteries are then subjected to several cycles of charge and discharge at the first battery temperature (normal temperature of 25° C.). The battery voltage at this time is measured, and plotted relative to current, and the slope of a regression line of these plots determined by applying a method of least squares is calculated. This calculated slope is determined as the first internal resistance.

Next, the process goes to step S4, where a second internal resistance R2 of each of the batteries 100 whose first internal resistance R.1 were measured at step S1 is measured at a second battery temperature which is lower than the normal temperature (−10° C. in this embodiment). The second internal resistance is measured by the measurement method of the first internal resistance, but with the battery temperature being changed to the second battery temperature (of —10° C. in this embodiment). This step S4 corresponds to a "second internal resistance measurement step".

Next, the process goes to step S5, where, from the plurality of batteries 100 whose second internal resistance R2 have been measured, batteries 100 having a second internal resistance R2 smaller than a preset threshold Th are selected. This way, batteries 100 that are not "electrode-deteriorated batteries" can be selected. Here, the "electrode-deteriorated battery" is a battery in which voltage drops more largely than in other batteries (normal batteries) because the current density reaches a limiting current density in the electrode when the battery is discharged continuously in a high-load condition (with a relatively large current in a predetermined range (of, e.g., 2 to 6 C) at a low battery temperature of 0° C. or lower, for example). Such electrode-deteriorated batteries must be excluded from batteries 100 to be selected for constituting a battery pack, from the viewpoint of preventing occurrence of a voltage abnormality as mentioned above. This step S5 corresponds to a "first selection step" and a "selection step". In this embodiment, the second battery temperature is the specific battery temperature, and the second internal resistance R2 is the specific internal resistance.

Figure 7:
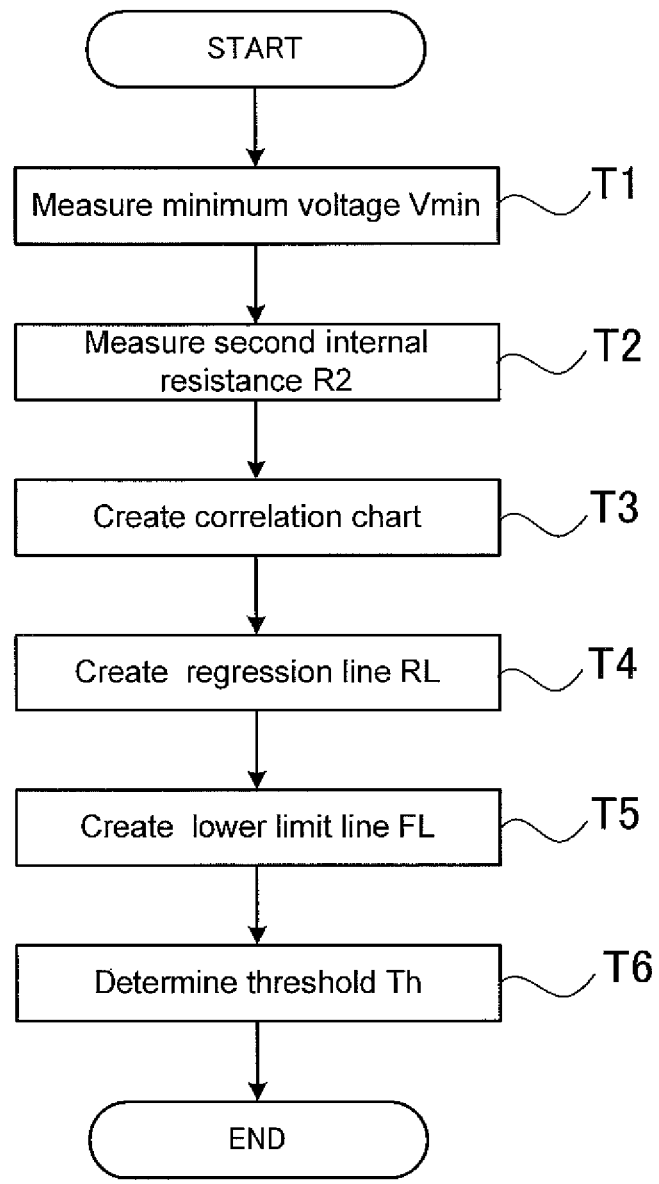
FIG. 7 is a flowchart explaining a method of determining the threshold of the second internal resistance.

Now, how the threshold Th is set will be explained. First, a multiplicity of sample secondary batteries used nickel-metal hydride secondary batteries 100 are prepared for the threshold setting purpose. Next, at step T1 as shown in FIG. 7, each sample secondary battery is discharged continuously under specific conditions (hereinafter referred to as "distinguishing discharge"), and the minimum voltage Vmin during this period is measured. More specifically, each sample secondary battery is subjected to a "continuous distinguishing discharge for a predetermined period with a discharge current predetermined to be within a distinguishing discharge current range", and the minimum voltage Vmin is measured at a battery temperature equivalent to the second battery temperature (−10° C. which is the same as the second battery temperature in this embodiment).

Distinguishing discharge may be any continuous discharge under high load (duty) during which the difference between the voltage drop amount of electrode-deteriorated batteries and that of non-electrode-deteriorated batteries is large. The battery temperature when measuring the minimum voltage Vmin (i.e., during the distinguishing discharge period) may be a temperature equivalent to the second battery temperature for when measuring the second internal resistance R2. "Battery temperature equivalent to the second battery temperature" shall be understood to include the following apart from the same temperature as the second battery temperature. More specifically, even if the battery temperature is not the same as the second battery temperature, if the battery temperature is in a range in which the correlation between the second internal resistance and minimum voltage is similar to the correlation obtained from the measurements made at the same temperature as the second battery temperature, such a temperature should be included in "the temperature equivalent to the second battery temperature". This is because sometimes it is difficult to use the same temperature as the second battery temperature that is used when measuring the specific internal resistance for measuring the minimum voltage due to differences in measurement methods of minimum voltage and internal resistance.

Figure 8:
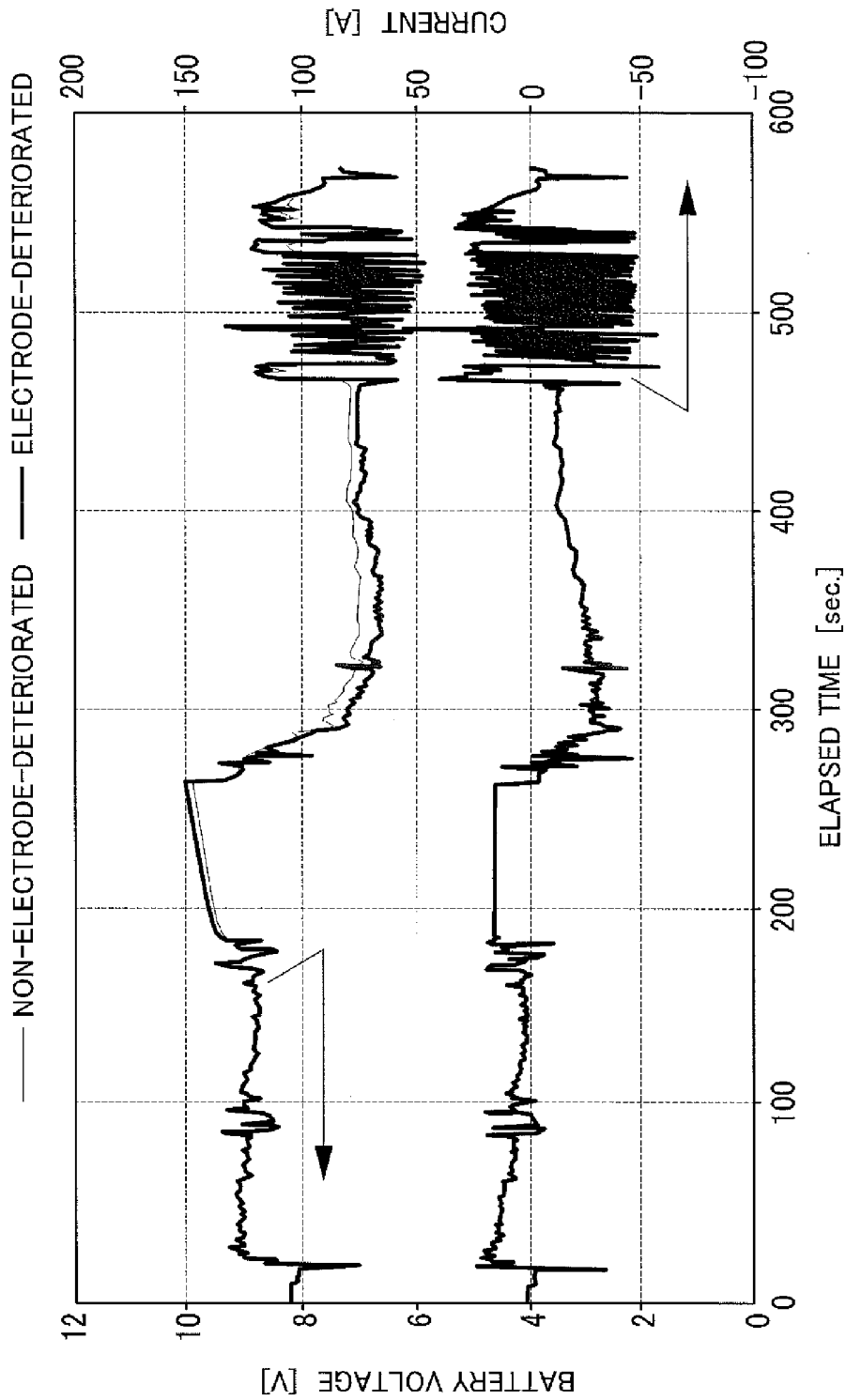
FIG. 8 is a chart illustrating a distinguishing discharge (continuous discharge)

Step T1 of this embodiment will be explained with reference to FIG. 8. In FIG. 8, the upper curves represent battery voltage, while the lower curve represents current. The battery voltage of electrode-deteriorated batteries (electrode deteriorated) is shown by a thick solid line, while the battery voltage of non-electrode-deteriorated batteries (electrode not deteriorated, or normal batteries) is shown by a thin solid line in the upper curves representing battery voltage. Discharge current is shown as negative, while charge current is shown as positive. In this embodiment, the sample secondary batteries were charged and discharged in the pattern shown in FIG. 8, including a distinguishing discharge that is a continuous discharge for a duration of 300 to 400 seconds (100 sec continuous discharge). The discharge current is within a range of 2 to 6 C (13 to 39 A) during this distinguishing discharge. When the batteries are discharged with a discharge current in such a range (distinguishing discharge current range) at a low battery temperature, the current density reaches a limiting current density at the electrode in electrode-deteriorated batteries, while it does not reach a limiting current density at the electrode in non-electrode-deteriorated batteries (normal batteries), as shown in FIG. 8, because of which the voltage drops largely in electrode-deteriorated batteries as compared to the voltage in normal batteries. The minimum voltage during the period of distinguishing discharge is clearly lower in electrode-deteriorated batteries than in non-electrode-deteriorated, normal batteries, as shown in FIG. 8.

Next, the process goes to step T2, where the second internal resistance R2 of each of the sample secondary batteries is measured at a second battery temperature (of −10° C. in this embodiment). The measurement method is the same as that used in step S4 described in the foregoing. Next, the process goes to step T3, where the measurement data of the sample secondary batteries 1005, i.e., second internal resistance and minimum voltage values, are plotted on a coordinate plane with axes representing the second internal resistance R2 and minimum voltage Vmin, to create a correlation chart. This correlation chart is shown in FIG. 9.

Figure 9:
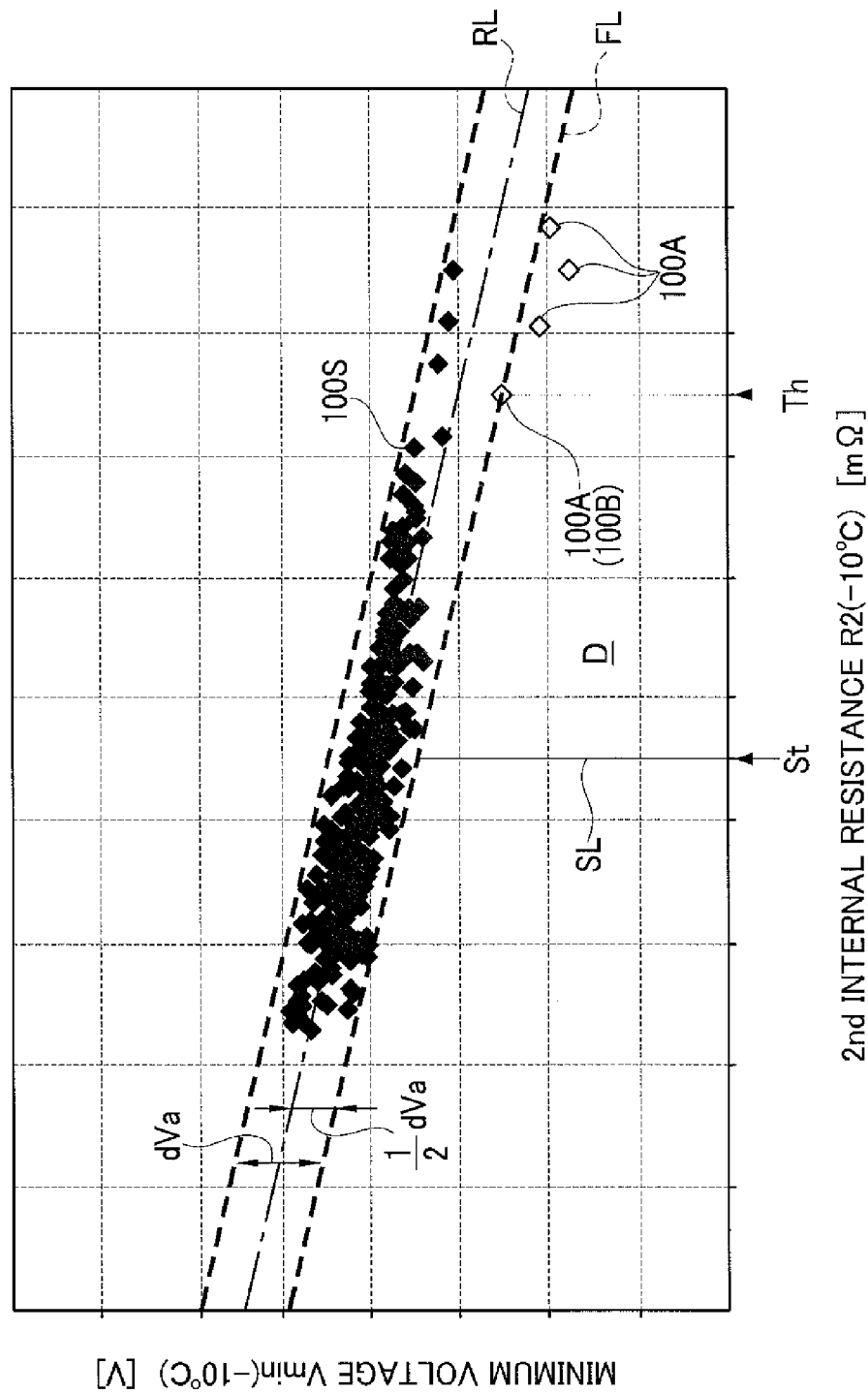
FIG. 9 is a correlation chart illustrating how the second internal resistance correlates to minimum voltage.

Next, the process goes to step T4, where a regression line RL is obtained from data on sample secondary batteries having a second internal resistance R2 not exceeding a reference value St in the correlation chart of FIG. 9. The regression line RL is obtained based on data of batteries having a second internal resistance that falls within a range that excludes "electrode-deteriorated batteries". Therefore, the "reference value St" for determining the regression line RL is an internal resistance that indicates that if batteries have it, those batteries are not "electrode-deteriorated batteries", and is determined in accordance with the type of secondary battery. If the used battery is a nickel-metal hydride secondary battery as in this embodiment, the "reference value St" should preferably be a value corresponding to 70% of the second internal resistance a battery initially has (e.g., non-used, new battery). The internal resistance of the nickel-metal hydride secondary battery reduces from the initial value as the battery is used and stabilizes at about 60% of the initial value. As deterioration progresses with the use, the internal resistance tends to rise gradually. From such characteristics of nickel-metal hydride secondary batteries, it is empirically known that there are no "electrode-deteriorated batteries" among the batteries having a second internal resistance of 70% or less of the initial value.

Next, the process goes to step T5, where a lower limit line FL is drawn in the correlation chart shown in FIG. 9, which is parallel to the regression line RL and shifted therefrom a predetermined value to a side where the minimum voltage Vmin is lower (lower in FIG. 9).

Next, the process goes to step T6, where, in the correlation chart shown in FIG. 9, sample secondary batteries contained in region D ("batteries in region 100A") where the second internal resistance R2 is larger than the reference value St and the minimum voltage Vmin does not exceed the lower limit line FL are arranged in ascending order of second internal resistance R2, and the ranking number is divided by the total number of sample secondary batteries 1005. Region D is a region of the correlation chart shown in FIG. 9 surrounded by a line SL (second internal resistance R2=reference value St), the lower limit line FL, and the coordinate axis (values on the line SL being not included, while values on the lower limit line FL being included). In this embodiment, as shown in FIG. 9, there are four batteries indicated by white rhombuses as "batteries in region 100A" contained in region D. Thus, if the total number of sample secondary batteries 1005 is 100, the calculated values will be $1/100$, $2/100$, $3/100$, and $4/100$ in ascending order of the second internal resistance R2.

Next, of the batteries in region 100A whose calculated values exceed a preset value, one with a smallest second internal resistance R2 is specified ("specified battery in region" 100B). In this embodiment, the preset value is zero. Therefore, all the four batteries indicated by rhombuses are batteries in region 100A with a calculated value exceeding the preset value (=0). The "specified battery in region" 100B then is the one with a smallest second internal resistance R2 (the one on the far left in FIG. 9) of the four batteries indicated by rhombuses. In this embodiment, the second internal resistance R2 of this specified battery in region 100B is used as the threshold Th. Namely, in this embodiment, the second internal resistance of a battery with a smallest second internal resistance R2, of the batteries having a larger second internal resistance R2 than the reference value St and a minimum voltage Vmin not exceeding the lower limit line FL (those under the lower limit line in FIG. 9), is used as the threshold Th.

The distance in the vertical axis direction between the regression line RL and the lower limit line FL (predetermined value mentioned above to determine the lower limit line FL from the regression line RL) may be set in consideration of a minimum voltage Vmin of electrode-deteriorated batteries to be excluded. Namely, the distance in the vertical axis direction between the regression line RL and the lower limit line FL (predetermined value mentioned above) may be set such that region D specifies an inappropriate range of minimum voltage for batteries to be selected. In this embodiment, the distance in the vertical axis direction between the regression line RL and the lower limit line FL (predetermined value mentioned above) is set to a value dVa/2, which is one half of an allowable voltage difference dVa between batteries 100 determined by the control device 30. This way, electrode-deteriorated batteries having a battery voltage difference from that of normal batteries that exceeds the allowable voltage difference dVa can be excluded. The distance in the vertical axis direction between the regression line RL and the lower limit line FL (predetermined value mentioned above) need not be limited to dVa/2 and may be larger, or smaller than dVa/2. If it is smaller than dVa/2, electrode-deteriorated batteries with a less severe degree of deterioration can also be excluded.

By thus setting the distance in the vertical axis direction between the regression line RL and the lower limit line FL (predetermined value mentioned above), batteries contained in region D in the correlation chart shown in FIG. 9 can be considered as electrode-deteriorated batteries, in which the current density will reach a limiting current density at an electrode and the battery voltage will drop more largely than that in normal batteries, when charged with a current equivalent to that of the previously described distinguishing discharge (2 to 6 C) at a low battery temperature. If such batteries are included in the battery pack 20, the control device 30 may detect a voltage abnormality as mentioned before. Accordingly, in this embodiment, the minimum value of the second internal resistance R2 of batteries contained in region D is used as the threshold Th, and batteries 100 having a second internal resistance smaller than this threshold Th are selected at step S5, so that batteries 100 that are not "electrode-deteriorated batteries" can be selected correctly.

Next, the process goes to step S6 (see FIG. 6), where a necessary number of batteries 100 (twenty eight in this embodiment) to build a battery pack 20 are selected, which have a maximum difference between first internal resistances not exceeding an allowable limit, as well as a maximum difference between second internal resistances not exceeding an allowable limit. More specifically, the batteries 100 selected at step S5 are sorted to corresponding groups in accordance with the combination (R1, R2) of their first internal resistance R1 and second internal resistance R2. Then, a number of batteries required for building a battery pack 20 (twenty eight in this embodiment) are selected from the batteries 100 in the same group. This step S6 corresponds to a "second selection step".

After that, the process goes to step S7, where twenty eight batteries 100 selected at step S6 are electrically connected in series to form the battery pack 20. This step S7 corresponds to an "assembling step".

In secondary batteries, the battery voltage tends to rise temporarily during charge or drop temporarily during discharge more largely if the internal resistance is large. However, since the battery pack 20 is configured by combining batteries 100 that have a maximum difference between first internal resistances not exceeding an allowable limit, as well as a maximum difference between second internal resistances not exceeding an allowable limit at step S6, a temporary increase in the battery voltage difference between batteries 100 during charge and discharge of the battery pack 20 can be suppressed. Thereby, the possibility that the control device 30 may determine that there is a voltage abnormality because of the influence of a temporary increase in the battery voltage difference between batteries 100 during charge and discharge of the battery pack 20 can be reduced.

The maximum difference between first internal resistances of batteries 100 that form the battery pack 20 in this case (difference between a largest first internal resistance and a smallest first internal resistance of the batteries 100) should preferably be 20% or less of the first internal resistance of the battery 100 having the smallest first internal resistance. The maximum difference between second internal resistances should preferably be determined likewise. This way, a temporary increase in the battery voltage difference between batteries 100 during charge and discharge of the battery pack 20 can be suppressed more reliably.

Figure 5:
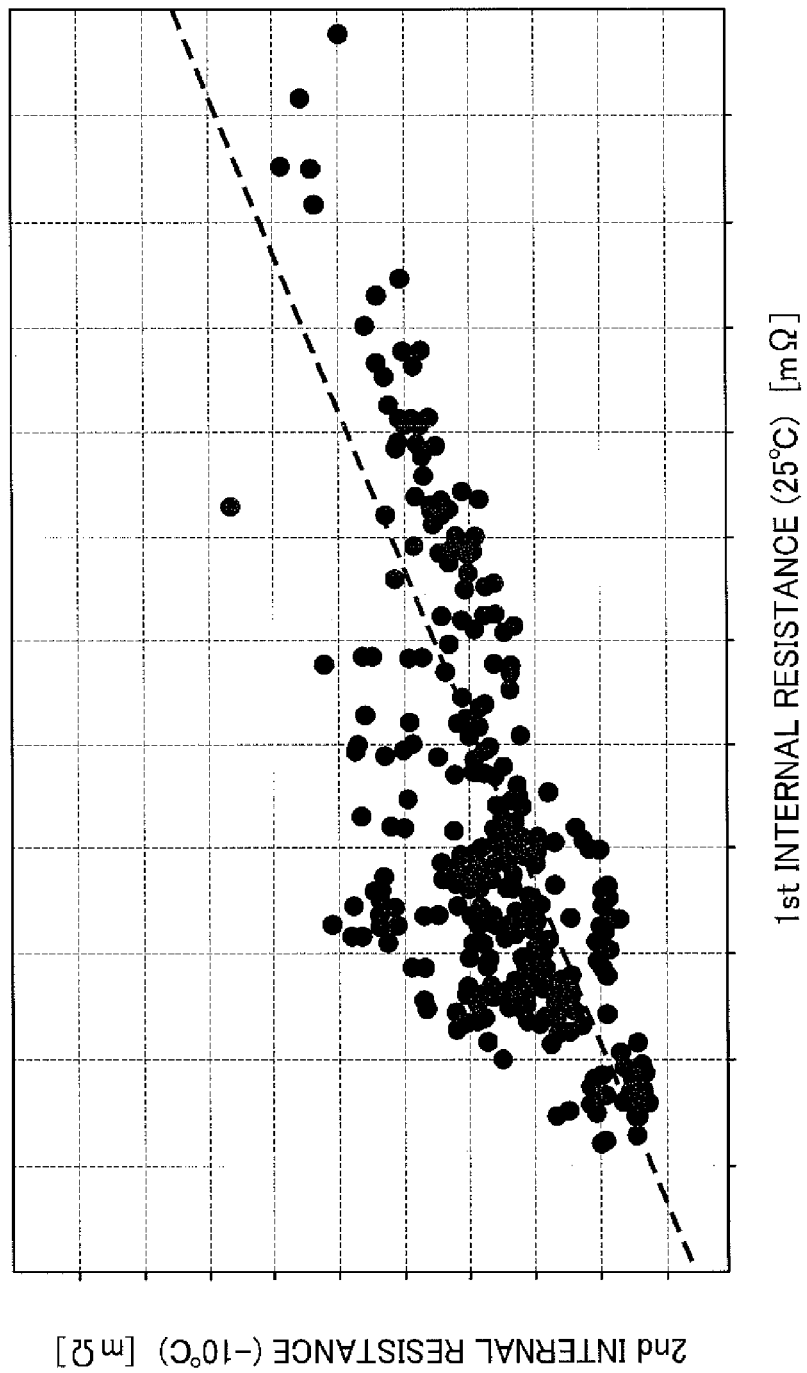
FIG. 5 is a correlation chart illustrating how a first internal resistance correlates to a second internal resistance.

It was found out that, as shown in FIG. 5, sometimes, the first internal resistance (internal resistance in a normal temperature environment) of batteries 100 correlates little to the second internal resistance (internal resistance in a low temperature environment). That is, sometimes, even when used secondary batteries have first internal resistances close to each other in a normal temperature environment, their second internal resistances in a low temperature environment would differ largely from each other. Therefore, if used secondary batteries that have an internal resistance close to each other in a normal temperature environment of 25° C. are combined to build a battery pack as shown in JP-A-2008-293703, although the maximum voltage difference between batteries during charge and discharge could be controlled within an allowable limit in a normal temperature environment, there was a possibility that the maximum difference between batteries could exceed an allowable limit in a low temperature environment and the control device 30 may detect it as a voltage abnormality.

With this in view, in this embodiment, as described above, the battery pack 20 is formed by batteries 100 having not only similar first internal resistances but also similar second internal resistances. More specifically, the battery pack 20 is formed by a plurality of batteries 100 having a maximum difference between first internal resistances not exceeding an allowable limit, as well as a maximum difference between second internal resistances not exceeding an allowable limit. This way, an increase in the battery voltage difference between the batteries 100 during charge and discharge can be suppressed not only in a first temperature environment (or at a first battery temperature) but also in a second temperature environment (or at a second battery temperature). Thereby, in a battery pack unit 50 in which the battery pack 20 is combined with the control device 30, the possibility that the maximum battery voltage difference may exceed an allowable limit because of the influence of a temporary increase in the battery voltage difference during charge and discharge and that the control device 30 may determine this as a voltage abnormality can be reduced.

While the presently preferred embodiment of the present invention has been shown and described, it is to be understood that this disclosure is for the purpose of illustration and that various changes and modifications may be made without departing from the scope of the invention as set forth in the appended claims.

For example, in the embodiment, at step T6, the second internal resistance of a sample secondary battery with a smallest second internal resistance R2 (specified battery in region 100B), of the sample secondary batteries contained in region D, having a larger second internal resistance R2 than the reference value St and a minimum voltage Vmin not exceeding the lower limit line FL (batteries in region 100A), is used as the threshold Th. Namely, sample secondary batteries contained in region D ("batteries in region 100A") are arranged in ascending order of second internal resistance R2, and the ranking number is divided by the total number of sample secondary batteries, and the second internal resistance R2 of the battery having a smallest second internal resistance R2 (specified battery in region 100B), of the batteries in region 100A having this calculated value exceeding a preset value (=0), is used as the threshold Th.

The preset value is zero because steps similar to preliminary selection steps S1 and S2 are performed prior to setting the threshold Th to ensure that there are no defective batteries other than electrode-deteriorated batteries in sample secondary batteries (in particular, batteries that fall within region D). Therefore, the number of defective batteries possibly contained in all the sample secondary batteries can be assumed to be zero, when the total number of all sample secondary batteries is considered.

However, if it is assumed that there may be some defective batteries in all sample secondary batteries, the preset value mentioned above may be determined in consideration of the percentage of defective batteries (in particular, batteries that fall within region D) that could be excluded from the plurality of used secondary batteries at preliminary selection steps of S1 and S2 (ratio of detected defective batteries to the total number of used secondary batteries subjected to preliminary selection steps). This way, even if there may be a sample secondary battery that is not electrode-deteriorated battery in region D, the threshold Th can be set correctly. This is particularly effective when the steps similar to the preliminary selection steps S1 and S2 cannot be performed and possibly defective batteries cannot entirely be excluded when setting the threshold Th.

Although the battery pack 20 is formed by twenty eight used nickel-metal hydride secondary batteries 100 in the embodiment, the number of used nickel-metal hydride secondary batteries may be any if it is two or more. Although used secondary batteries were described as nickel-metal hydride secondary batteries in this embodiment, the present invention may be applied to other secondary batteries such as lithium ion secondary batteries.

In the embodiment, at step S1, it was determined whether or not the batteries had a discharge reserve capacity at or above an allowable level based on the difference in capacity between battery blocks. However, such determination of whether or not the discharge reserve capacity at the negative electrode is below an allowable minimum may be made by any known method. In the embodiment, at step S2, it was determined whether or not there were small short circuits in the batteries based on the battery voltage change rate at the end of discharge. However, such determination of whether or not there are small short circuits in the batteries may be made by any known method.

REFERENCE SIGNS LIST

10 Battery block
20 Battery pack
30 Control device
50 Battery pack unit
100 Used nickel-metal hydride secondary battery (Used secondary battery)
100A Battery in region
100B Specified battery in region
D Region
dVa Allowable voltage difference
½dVa One half of an allowable voltage difference
RL Regression line
FL Lower limit line
R1 First internal resistance
R2 Second internal resistance (Specific internal resistance)
St Reference value
Th Threshold
Vmin Minimum voltage

The invention claimed is:

1. A method of selecting a used secondary battery that is reusable from a plurality of collected used secondary batteries, comprising:
 an internal resistance measurement step of measuring a specific internal resistance at a specific battery temperature of each of the used secondary batteries; and
 a selection step of selecting used secondary batteries having the specific internal resistance smaller than a preset threshold from the plurality of used secondary batteries whose specific internal resistances have been measured;
 the threshold being set by a process including a step of measuring the specific internal resistance of each of a plurality of sample secondary batteries that are used secondary batteries prepared for determining the threshold;
 continuously discharging each of the sample secondary batteries at a battery temperature equivalent to the specific battery temperature, and measuring a minimum voltage in the each sample secondary battery during a period of the discharge;
 plotting the specific internal resistances and the minimum voltages of each of the sample secondary batteries to create a correlation chart;
 determining a regression line of sample secondary batteries including at least all of the sample secondary batteries having a specific internal resistance not exceeding a reference value among the plurality of sample secondary batteries in the correlation chart;
 determining a lower limit line that is parallel to the regression line and shifted a predetermined value from the regression line to a side where the minimum voltage is lower in the correlation chart;
 calculating a value obtained by dividing a ranking number of batteries in region of the plurality of sample secondary batteries in ascending order of the specific internal resistance by a total number of sample secondary batteries, wherein the batteries in region are contained in a region of the correlation chart where the specific internal resistance is larger than the reference value and the minimum voltage does not exceed the lower limit line;
 specifying a battery having a smallest specific internal resistance out of the batteries contained in the region and having a calculated value exceeding a preset value; and
 setting the specific internal resistance of the specified battery contained in the region as the threshold.

2. The method of selecting a used secondary battery according to claim 1, wherein the regression line is a regression line of sample secondary batteries having a specific internal resistance not exceeding the reference value, of the plurality of sample secondary batteries.

3. The method of selecting a used secondary battery according to claim 1, wherein the predetermined value for determining the lower limit line is one half of an allowable voltage difference between the used secondary batteries determined by a control device of a battery pack during use of the battery pack formed by the plurality of used secondary batteries.

4. The method of selecting a used secondary battery according to claim 1, wherein the specific battery temperature in the internal resistance measurement step is a temperature of 0° C. or less.

5. The method of selecting a used secondary battery according to claim 1, wherein
 the used secondary batteries are used nickel-metal hydride secondary batteries, and
 the reference value is a value of 70% of the specific internal resistance a nickel-metal hydride secondary battery initially has.

6. A method of manufacturing a battery pack formed by combining a plurality of used secondary batteries, comprising:
 a step of selecting a plurality of used secondary batteries from the plurality of used secondary batteries selected by the method of selecting a used secondary battery according to claim 1 such that a maximum difference between the specific internal resistances is within an allowable limit; and
 an assembling step of forming a battery pack by electrically connecting the plurality of selected used secondary batteries.

7. A method of manufacturing a battery pack formed by combining a plurality of used secondary batteries, comprising:
 a first internal resistance measurement step of measuring a first internal resistance at a first battery temperature that is a normal temperature of each of the used secondary batteries;
 a second internal resistance measurement step of measuring a second internal resistance at a second battery temperature that is lower than the normal temperature of each of the used secondary batteries;
 a first selection step of selecting used secondary batteries having the second internal resistance smaller than a preset threshold from the plurality of used secondary batteries whose second internal resistances have been measured;
 a second selection step of selecting a plurality of used secondary batteries having a maximum difference between the first internal resistances not exceeding an allowable limit, as well as a maximum difference between the second internal resistances not exceeding the allowable limit, from the plurality of the used secondary batteries selected in the first selection step;
 an assembling step of forming the battery pack by electrically connecting the plurality of the used secondary batteries selected in the second selection step, the threshold being set by a process including a step of measuring the second internal resistance of each of a plurality of sample secondary batteries that are used secondary batteries prepared for determining the threshold;

continuously discharging each of the sample secondary batteries at a battery temperature equivalent to the second battery temperature, and measuring a minimum voltage in the each sample secondary battery during a period of the discharge;

plotting the second internal resistances and the minimum voltages of each of the sample secondary batteries to create a correlation chart;

determining a regression line of sample secondary batteries including at least all of the sample secondary batteries having a specific internal resistance not exceeding a reference value among the plurality of sample secondary batteries in the correlation chart;

determining a lower limit line that is parallel to the regression line and shifted a predetermined value from the regression line to a side where the minimum voltage is lower in the correlation chart;

calculating a value obtained by dividing a ranking number of batteries in region of the plurality of sample secondary batteries in ascending order of the second internal resistance by a total number of the sample secondary batteries, wherein the batteries in region are contained in a region of the correlation chart where the second internal resistance is larger than the reference value and the minimum voltage does not exceed the lower limit line;

specifying a battery having a smallest second internal resistance out of the batteries contained in the region and having a calculated value exceeding a preset value; and setting the second internal resistance of the specified battery contained in the region as the threshold.

8. The method of manufacturing a battery pack according to claim 7, wherein the second battery temperature in the second internal resistance measurement step is a temperature of 0° C. or less.

9. The method of manufacturing a battery pack according to claim 7, wherein the used secondary batteries are used nickel-metal hydride secondary batteries, and the reference value is a value of 70% of the second internal resistance a nickel-metal hydride secondary battery initially has.

* * * * *